United States Patent
Yang (10) Patent No.: US 7,259,067 B2
(45) Date of Patent: Aug. 21, 2007

(54) METHOD FOR MANUFACTURING FLASH MEMORY DEVICE

(75) Inventor: In Kwon Yang, Icheon-Shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 404 days.

(21) Appl. No.: 10/872,725

(22) Filed: Jun. 21, 2004

(65) Prior Publication Data

US 2005/0095784 A1 May 5, 2005

(30) Foreign Application Priority Data

Nov. 3, 2003 (KR) .................. 10-2003-0077246

(51) Int. Cl.
*H01L 21/336* (2006.01)

(52) U.S. Cl. .................. 438/264; 438/257; 438/268; 257/E21.645; 257/E29.129

(58) Field of Classification Search ............. 438/257, 438/264, 268
See application file for complete search history.

(56) References Cited

U.S. PATENT DOCUMENTS

| 6,229,176 B1* | 5/2001 | Hsieh et al. ............. 257/316 |
| 6,455,374 B1* | 9/2002 | Lee et al. ............. 438/257 |
| 2002/0171101 A1* | 11/2002 | Hsu et al. ............. 257/314 |

FOREIGN PATENT DOCUMENTS

| KR | 1020020048616 A | 6/2002 |
| KR | 1020020096610 A | 12/2002 |
| KR | 1020050009642 A | 1/2005 |

* cited by examiner

*Primary Examiner*—Alexander Ghyka
(74) *Attorney, Agent, or Firm*—Marshall, Gerstein & Borun LLP

(57) ABSTRACT

The present invention relates to a method for manufacturing a flash memory device. A plurality of conductive layers and dielectric layers are etched in a single etch apparatus, thus forming a control gate and a floating gate. In a gate formation process in which a thickness of a floating gate is over 1500 Å, problems in short process time and short mass production margin in an existing process can be solved while completely stripping a dielectric layer fence.

17 Claims, 13 Drawing Sheets

METHOD FOR MANUFACTURING FLASH MEMORY DEVICE

BACKGROUND

1. Field of the Invention

The present invention relates to a method for manufacturing a flash memory device, and more specifically, to a method for manufacturing a flash memory device wherein a hard mask is patterned and an etch process is then performed in a single etch apparatus, forming a control gate and a floating gate.

2. Discussion of Related Art

A conventional method for manufacturing a flash memory device will now be described with reference to the layout of FIG. 1. FIG. 2A to FIG. 6A show cross-sectional views taken along lines A-A' in FIG. 1, and FIG. 2B to FIG. 6B show cross-sectional views taken along lines B-B' in FIG. 1.

Figure 1:
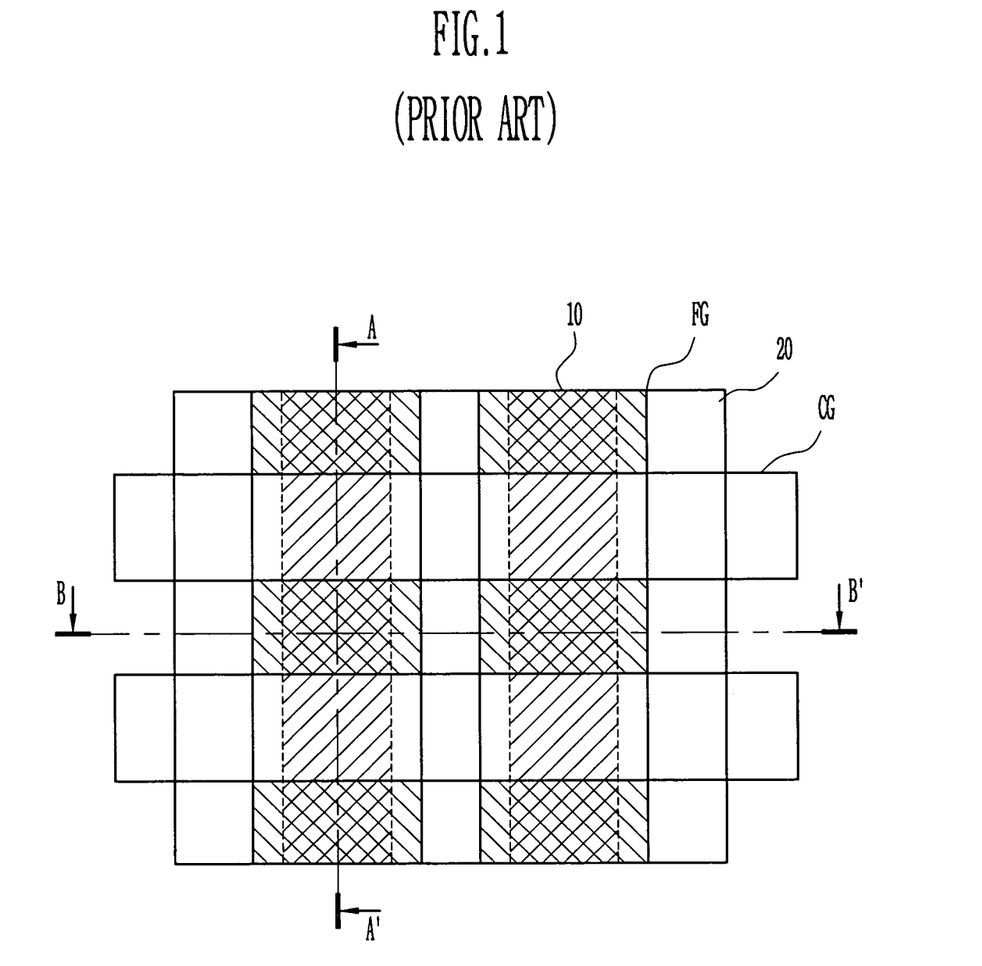
FIG. 1 is a layout diagram illustrating a flash memory device.

FIG. 1 is a layout diagram illustrating a NAND type data flash memory device. The NAND type data flash memory device includes an isolation layer 20 for isolating a semiconductor substrate 10 into an active region and a field region at predetermined regions on a semiconductor substrate 10, a floating gate FG a portion of which is overlapped with the isolation layer 20, wherein the floating gate FG is formed on the active region, and a control gate CG formed to intersect the floating gate FG.

FIGS. 2A to 6A and FIG. 2B to FIG. 6B are cross-sectional views for explaining problems of a method for manufacturing a flash memory device in the related art. FIG. 2A to FIG. 6A are cross-sectional views taken along lines A-A' in FIG. 1, and FIGS. 2B to 6B are cross-sectional views taken along lines B-B' in FIG. 1.

Figure 2A:
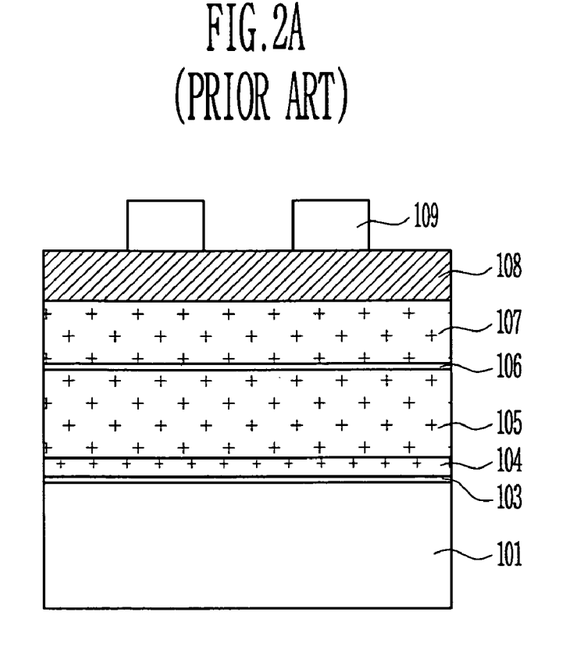
Figure 2B:
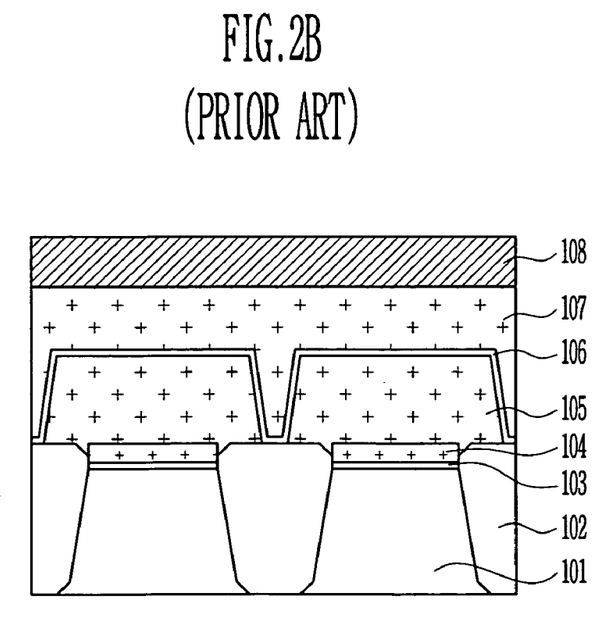

Referring to FIG. 2A and FIG. 2B, a tunnel oxide layer 103 and a first conductive layer 104 are formed on a semiconductor substrate 101. A self-aligned shallow trench isolation (hereinafter, referred to as "SASTI") process is then implemented to form an isolation layer 102. A second conductive layer 105 is formed on the entire structure. The second conductive layer 105 is patterned to form a floating gate pattern having first and second conductive layers 104 and 105.

A dielectric layer 106, a third conductive layer 107 and a fourth conductive layer 108 of an ONO structure are formed on the entire structure. After a hard mask layer 109 is formed on the fourth conductive layer 108, a pattering process using a mask for forming a gate electrode is performed to pattern the hard mask layer 109.

Figure 3A:
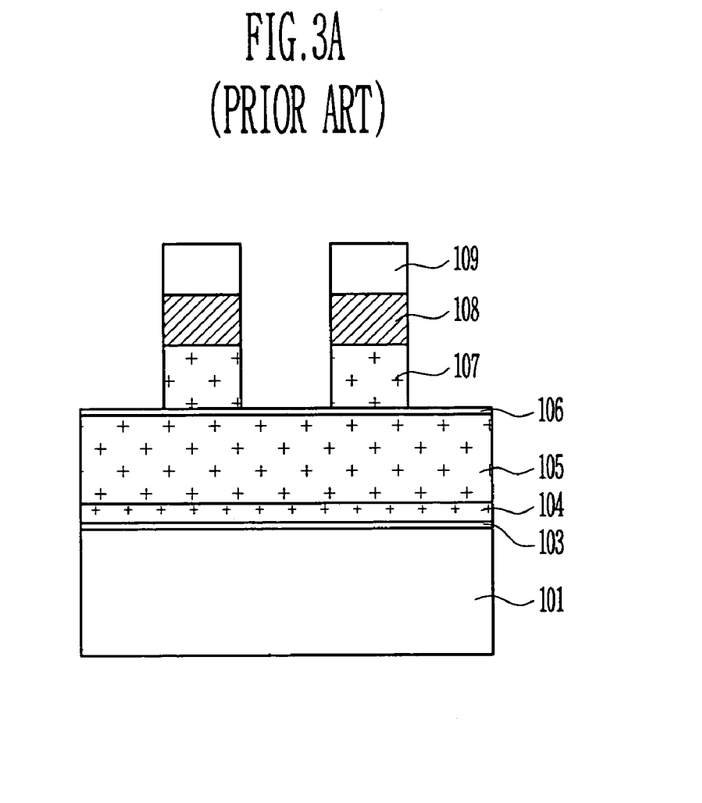
Figure 3B:
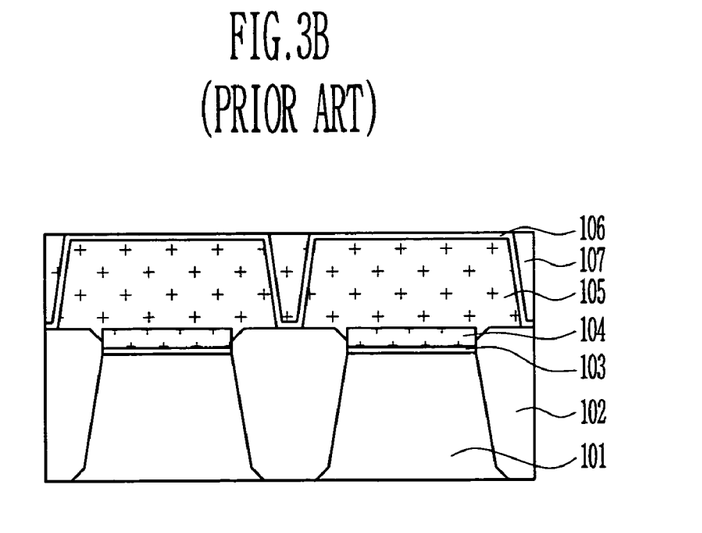

Referring to FIG. 3A and FIG. 3B, the fourth conductive layer 108 and the third conductive layer 107 are etched by means of an etch process using the hard mask layer 109. Although the third conductive layer 107 in the active region is stripped, the third conductive layer 107 formed in the field region remains as much as the step of the second conductive layer 105.

Figure 4A:
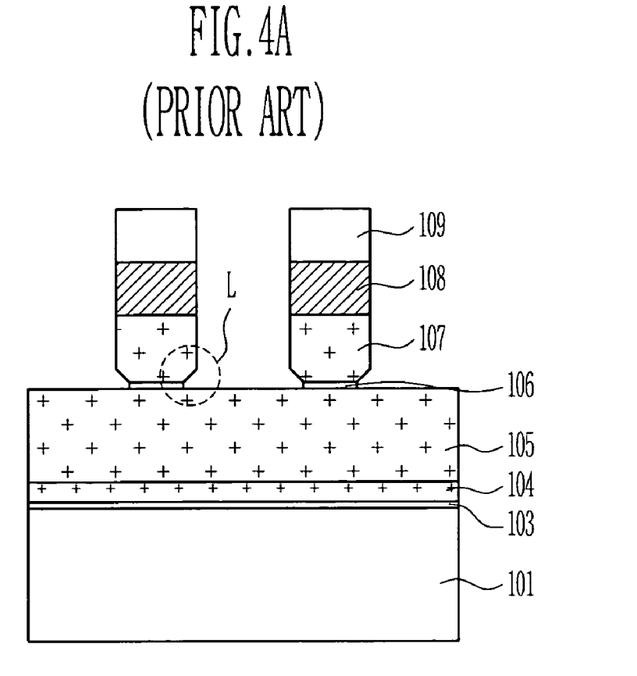
Figure 4B:
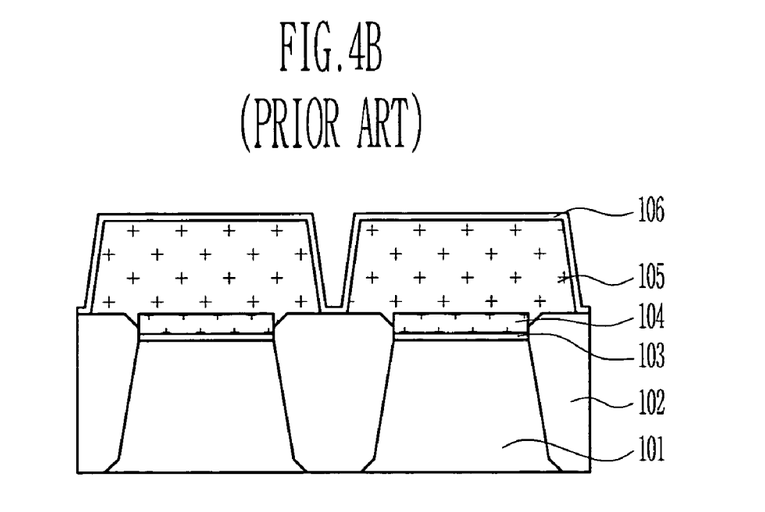

By reference to FIG. 4A and FIG. 4B, in order to strip the third conductive layer 107 remaining on the field region, an excessive etch process is performed. At this time, the third conductive layer 107 exposed in the active region is etched by mans of over-etch, resulting in an under cut (L). In other words, there are problems that electrical properties of the device are degraded since the patterned sidewall of the third conductive layer 107 in the active region is recessed during the over-etch.

Figure 5A:
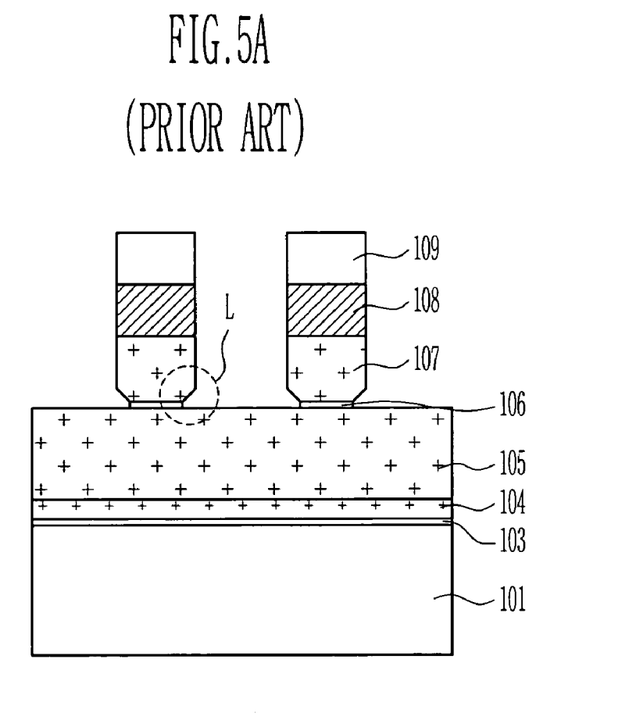
Figure 5B:
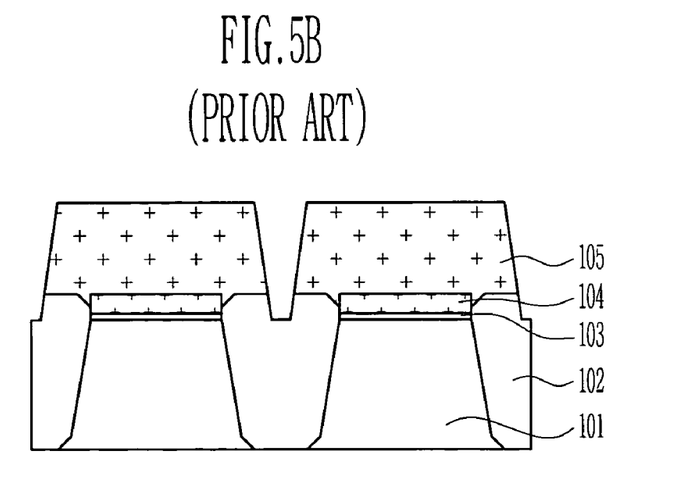

Referring to FIG. 5, an etch process for stripping the dielectric layer 106 of the ONO structure is performed. At this time, if the second conductive layer 105 is formed in thickness of over 2000 Å in order to secure the coupling ratio, some of the hard mask layer 108 and the isolation layer 102 are damaged in the over-etch process for completely stripping the dielectric layer 106.

Figure 6A:
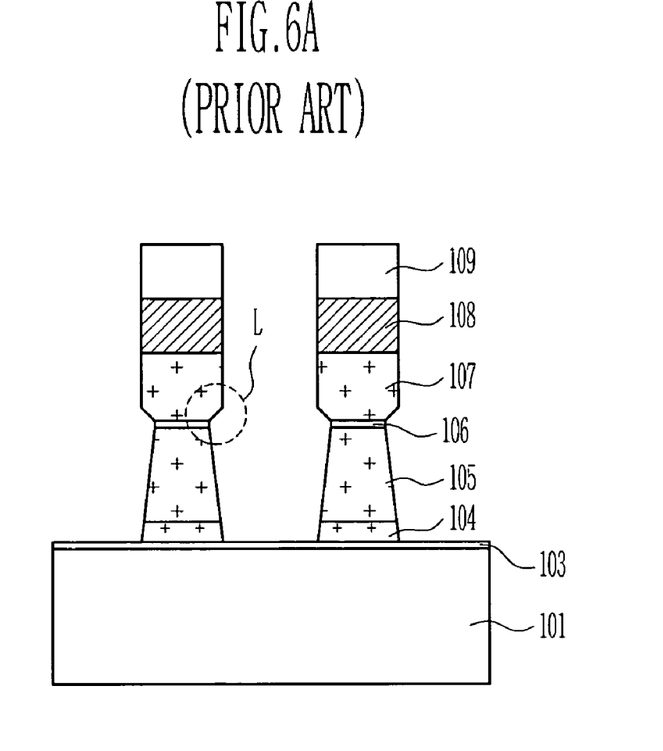
Figure 6B:
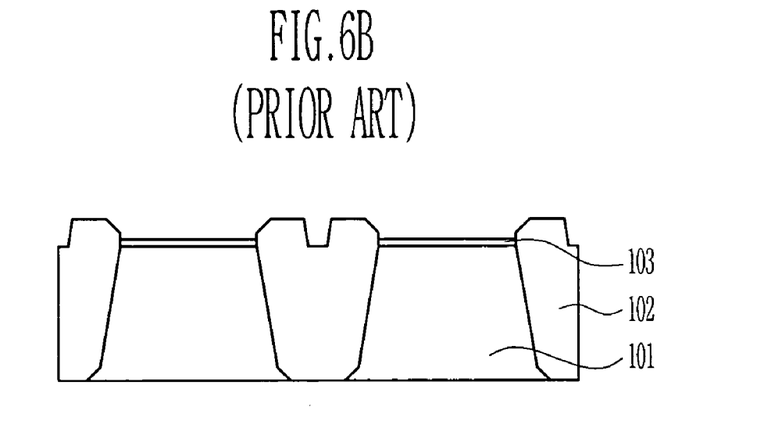

Referring to FIG. 6, the second conductive layer 105 is etched. In this process, the first conductive layer 104 beneath the second conductive layer 105 is also etched, thereby isolating a floating gate 110. Thus a gate electrode in which the tunnel oxide layer 103, the isolated floating gate 110, the dielectric layer 106, and the control gates 107 and 108 are stacked is formed.

As described above, the conventional method for manufacturing the flash memory device has problems that mass production margin is very low due to an increased process since the formation process of the control gate and the isolation process of the floating gate are performed in two-fold processes and management of the process and equipment is difficult due to the two-fold etch process.

Furthermore, in an existing flash memory device of below 256M, a second conductive layer is formed in thickness of about 500 Å-1000 Å. Thus a dielectric layer fence can be implemented separately from the floating gate etch process. As electrical reliability depending on mass storage and higher-integration of the flash memory device is increased, the second conductive layer is formed in thickness of over 1500 Å so as to secure a high coupling ratio. As the process of stripping the dielectric layer in the two-fold etch has to be separately performed, a more process time is required.

Meanwhile, another problem in the gate formation process of the conventional NAND type flash memory device is control of critical dimension (CD) and a gate profile in the gate line, and defective management through a plurality of equipments for performing a plurality of processes.

A problem in the final critical dimension of the gate results in variation in the threshold voltage and a sheet resistance problem depending on variation in the coupling ratio and the final critical dimension of the flash memory device. The greater the number of the process for forming the gate line, the greater the number of parameters that affect variation in the critical dimension of the gate line. Resultantly, control of the gate line critical dimension becomes inevitably problematic.

In addition, the control problem of the gate profile is likely to result in inclination of the gate profile or damage of the side profile depending on implementation of three-times dry etches. In a state where the side of the second and third conductive layers exposed when the control gate is experienced by dry etch is exposed, the dielectric layer is experienced by dry etch and an underlying conductive layer is experienced by dry etch. It is thus difficult to control the gate profile.

Furthermore, in securing mass production margin of the flash memory device and improving the yield of the device, reduction in the yield due to defects is an important problem that should be handled in all the memory and non-memory products. This can be basically improved by managing the process and equipment or improving the etch condition. It is, however, preferred that the number of the process is simplified, so that the effect of exposure is reduced. This is the most important problem in the process setup.

SUMMARY OF THE INVENTION

The present invention is directed to a method for manufacturing a flash memory device which can solve problems in small process margin and mass production margin in the existing process, while completely stripping a dielectric layer fence, in a gate formation process in which a thickness of a second conductive layer used as a floating gate is over 1500 Å.

Another object of the present invention is to provide a method for manufacturing a flash memory device wherein an etch process for forming a control gate and a floating gate is performed in a single etch apparatus, whereby the process is simplified while damage of a semiconductor substrate is prevented.

According to a preferred embodiment of the present invention, there is provided a method for manufacturing a flash memory device, comprising: forming a tunnel oxide layer and a first conductive layer on a semiconductor substrate and then performing a STI process to form an isolation structure that defines a first region and a second region; a forming a second conductive layer on the entire structure and then patterning the second conductive layer and first conductive layer to form a floating gate pattern; forming a dielectric layer, a third conductive layer, a fourth conductive layer and a hard mask layer on the entire structure and then patterning the hard mask layer; and forming a control pate and a floating pate by performing an etching process from the fourth conductive layer to the first conductive layer in a single etch apparatus using the hard mask layer as a mask.

Further, the etching process comprises the steps of over-etching the fourth conductive layer; etching the third conductive layer to expose the dielectric layer on the first region, and implementing over-etch for a thickness of the third conductive layer to expose the dielectric layer on the second region; etching the dielectric layer to expose some of the second conductive layer on the first region, and etching some of the third conductive layer and second conductive layer while stripping some of the dielectric layer on the second region; stripping the third conductive layer remaining on the second region; etching the second conductive layer on the first region and at the same time stripping the dielectric layer and second conductive layer remaining on the second region; and stripping the first conductive layer.

BRIEF DESCRIPTION OF THE DRAWINGS

FIGS. 2A to 6A are cross-sectional views taken along lines A-A' in FIG. 1 and FIGS. 2B to FIG. 6B are cross-sectional views taken along lines B-B' in FIG. 1 for explaining a method for manufacturing a flash memory device in the related art; and FIGS. 7A to 13A are cross-sectional views taken along lines A-A' and FIGS. 7B to 13B are cross-sectional views taken along lines B-B' in FIG. 1 for explaining a method for manufacturing a flash memory device according to the present invention.

DETAILED DESCRIPTION OF PREFERRED EMBODIMENTS

Now the preferred embodiments according to the present invention will be described with reference to the accompanying drawings.

FIG. 1 is a layout diagram illustrating a NAND type data flash memory device. The NAND type data flash memory device includes an isolation layer 200 for isolating a semiconductor substrate 100 into an active region and a field region at predetermined regions on the semiconductor substrate 100, a floating gate FG a portion of which is overlapped with the isolation layer 200, wherein the floating gate FG is formed on the active region, and a control gate CG formed to intersect the floating gate FG.

Figure 7A:
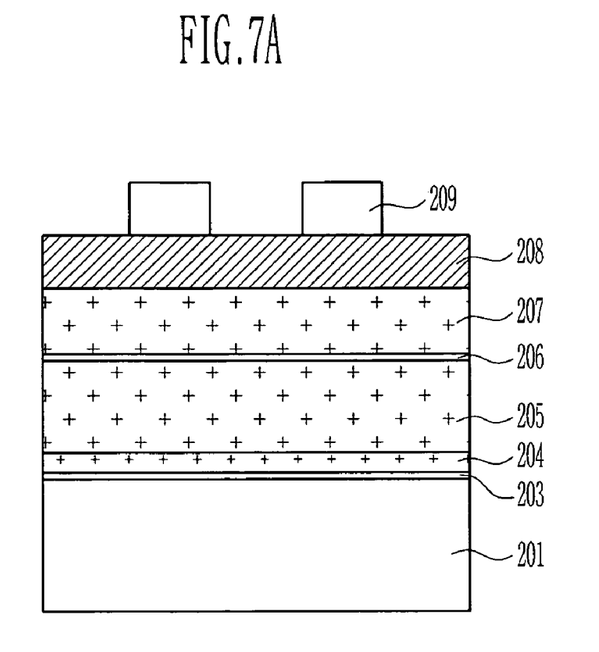
Figure 7B:
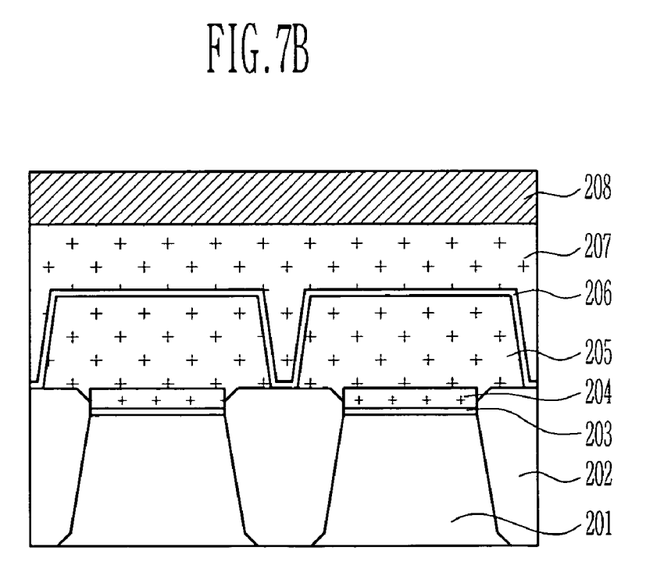

FIGS. 7A to 13A and FIGS. 7B to 13B are cross-sectional views for explaining a method for manufacturing a flash memory device according to the present invention. FIGS. 7A to 13A are cross-sectional views taken along lines A-A' in FIG. 1, and FIGS. 7B to 13B are cross-sectional views taken along lines B-B' in FIG. 1. In the above, FIG. 7A and FIG. 7B show a process for patterning a hard mask layer, and FIGS. 8A to 13A and FIGS. 8B and 13B show processes for forming a stack gate electrode through a single etch process in the same equipment. FIGS. 8A to FIG. 13A and FIGS. 8B and 13B are shown separately for convenience of explanation, but are consecutive processes performed in a single etch apparatus.

Referring to FIG. 7A and FIG. 7B, a tunnel oxide layer 203 and a first conductive layer 204 are formed on a semiconductor substrate 201. A SASTI is then implemented to form an isolation layer 202 that defines an active region and a field region. After a second conductive layer 205 is formed on the entire structure, the second conductive layer 205 is patterned to form a floating gate 210 pattern having the first and second conductive layers 204 and 205. A dielectric layer 206, a third conductive layer 207 and a fourth conductive layer 208 of an ONO structure are formed on the entire structure. After a hard mask layer 209 is formed on the fourth conductive layer 208, the hard mask layer 209 is patterned by a pattering process using a mask for forming a gate electrode. By means of this process, the hard mask layer 209 is left remained on lines A-A' as shown in FIG. 7A, but the hard mask layer 209 is completely stripped on lines B-B' as shown in FIG. 7B.

In the above, the hard mask layer 209 has a structure in which an insulating layer and an anti-reflection layer are stacked. For example, the stack structure may include one of a stack structure of an anti-reflection layer, a PE-TEOS layer and an anti-reflection layer, a stack structure of an anti-reflection layer, a plasma enhanced nitride layer and an anti-reflection layer, a stack structure of a PE-TEOS layer and an anti-reflection layer, and a stack structure of a nitride layer and an anti-reflection layer. Furthermore, the etch process of the hard mask layer 209 is performed in the etch apparatus of a MERIE type. In order to improve the final critical dimension, a process kit may be changed or the etch condition may be improved. At this time, in the process kit, a center injector hole may be shut or 2 to 5 injector holes may be used. Also a silicon insert ring includes an upper silicon integrated type in quartz.

Moreover, the method for improving the etch condition includes using a $CF_4/CHF_3/O_2$ mixed gas or a $CF_4/CHF_3$ mixed gas at a high pressure of 80-150 mT so as to prevent erosion of a photoresist layer used in the etch process of the hard mask layer 209. At this time, in case of $CF_4$ and $CHF_3$, $CF_4$ of 60□90 sccm and $CHF_3$ of 20-50 sccm may be introduced so that they are mixed in the ratio of 1.5:1 to 3:1, or $CF_4$ of 20-50 sccm and $CHF_3$ of 60-90 sccm may be introduced so that they are mixed in the ratio of 1:1.5 to 1:3. Meanwhile, in order to prevent damage of the top of the fourth conductive layer 208 and to improve sheet resistance of the gate line, an anneal process may be carried out under nitrogen atmosphere after an anti-reflection layer is formed. The anneal process may be performed after a lower anti-reflection layer, an insulating layer and an upper anti-reflection layer are sequentially formed.

Figure 8A:
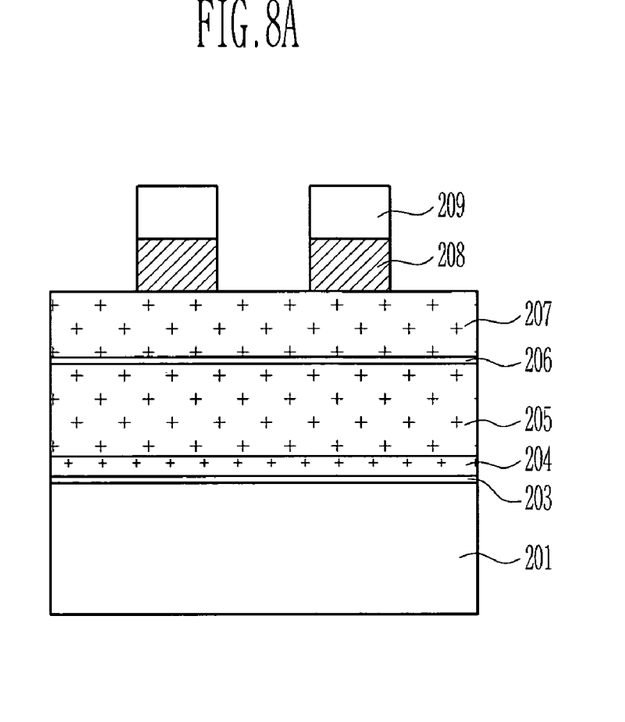
Figure 8B:
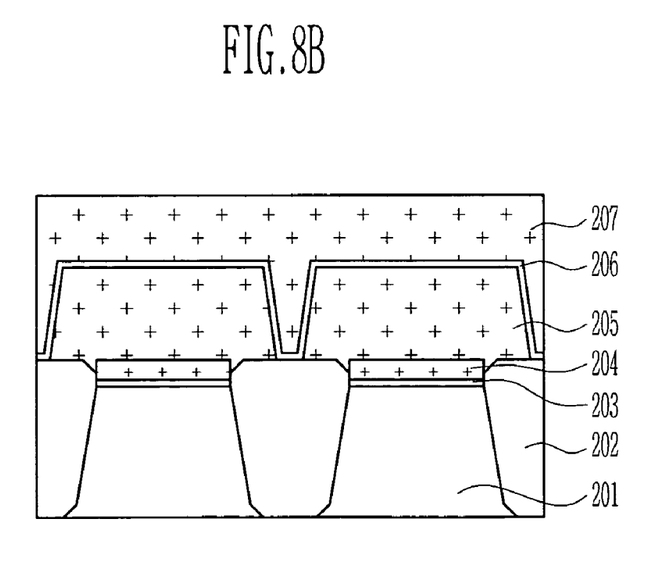

Referring to FIG. 8A and FIG. 8B, the fourth conductive layer 208 is etched using the patterned hard mask 209 as a mask in the etch apparatus of a RIE or MERIE type. At this time, the fourth conductive layer 208 is etched using a mixed gas of $Cl_2/CF_4/N_2$ or $Cl_2/SF_6/N_2$ at a pressure of 4-10 mT. In this case, Cl2 of 100-140 sccm and $CF_4$ of 10-20 sccm may be introduced so that there are mixed in the ratio of 6:1 to 8:1. Further, $Cl_2$ of 100-140 sccm and $SF_6$ of 5-10 sccm may be introduced so that they are mixed in the ratio of 14:1 to 16:1. In both cases, N2 is introduced about 5-20 sccm. Meanwhile, the etch process of the fourth conductive layer 208 is performed using a time point where the fourth conductive layer 208 is completely stripped as EOP (End Of Point). The fourth conductive layer 208 that remains locally is completely stripped by performing over-etch of 20-50% than the EOP time. Accordingly, the fourth conductive layer 208 is patterned on lines A-A' by the patterned hard mask layer 209 as shown in FIG. 8A, but the fourth conductive layer 208 is completely stripped on lines B-B' as shown in FIG. 8B.

Figure 9A:
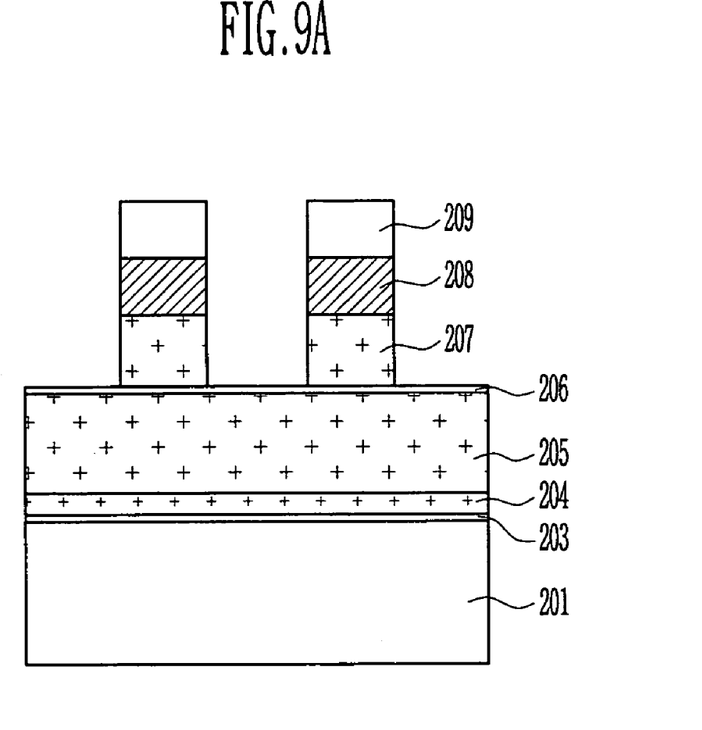
Figure 9B:
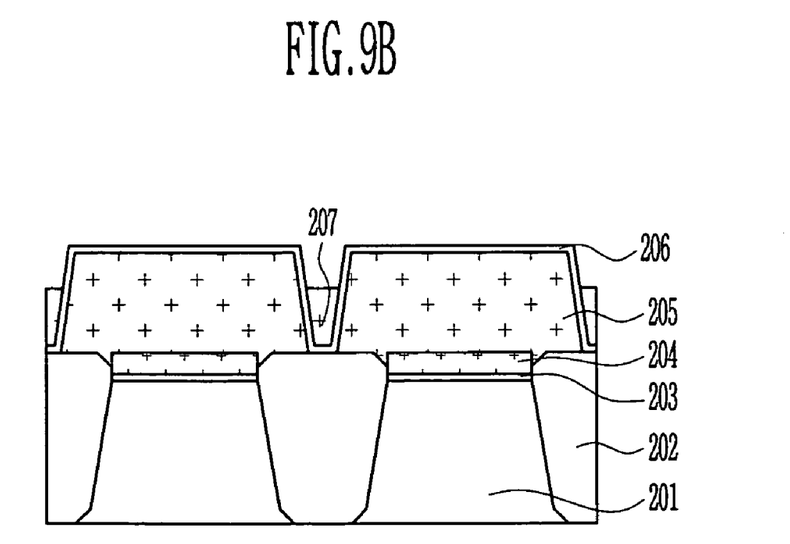

Referring to FIG. 9A and FIG. 9B, the third conductive layer 207 is etched. In this case, the etch process is stopped when the dielectric layer 206 is exposed without completely stripping the third conductive layer 207, and only over-etch of about 20-30% is performed for a thickness of the third conductive layer 207, so that the third conductive layer 207 remains. The etch process at this time is performed using a gas in which HBr and $O_2$ are mixed in the ratio of 35:1 to 40:1 at a pressure of 30-70 mT. In this case, HBr is introduced about 100-200 sccm and $O_2$ is introduced about 1-5 sccm. Accordingly, the third conductive layer 207 is patterned and the dielectric layer 206 is thus exposed on lines A-A', as shown in FIG. 9A, but the third conductive layer 207 is over-etched about 20-30% on lines B-B' as shown in FIG. 9B, whereby the second conductive layer 205 and the dielectric layer 206 thereon remain in a protruded shape. If the third conductive layer 207 is patterned through this process, it is possible to prevent generation of a profile undercut that may be caused by unreasonable over-etch in order to completely strip the third conductive layer 207 remaining between the floating gate pattern and the floating gate pattern.

Figure 10A:
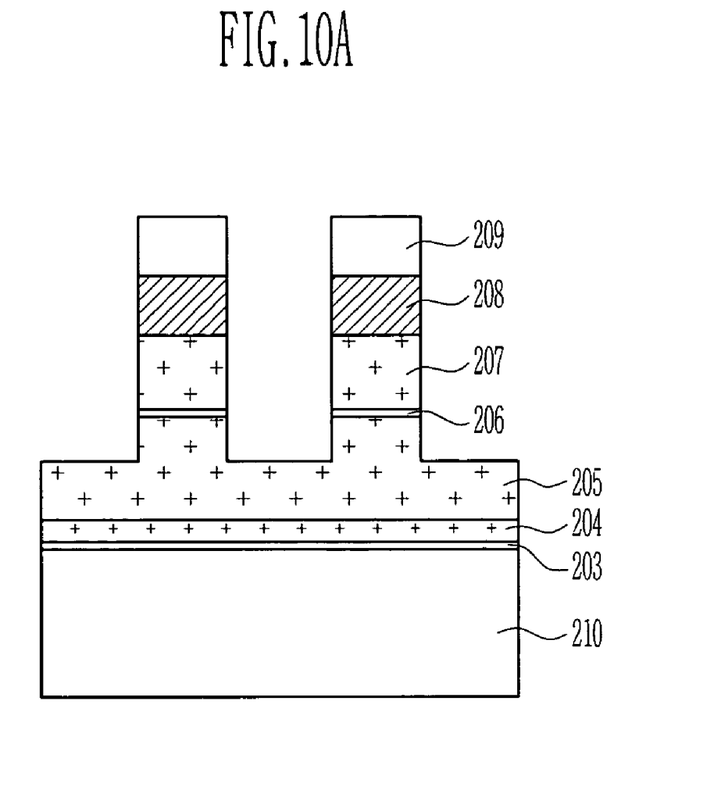
Figure 10B:
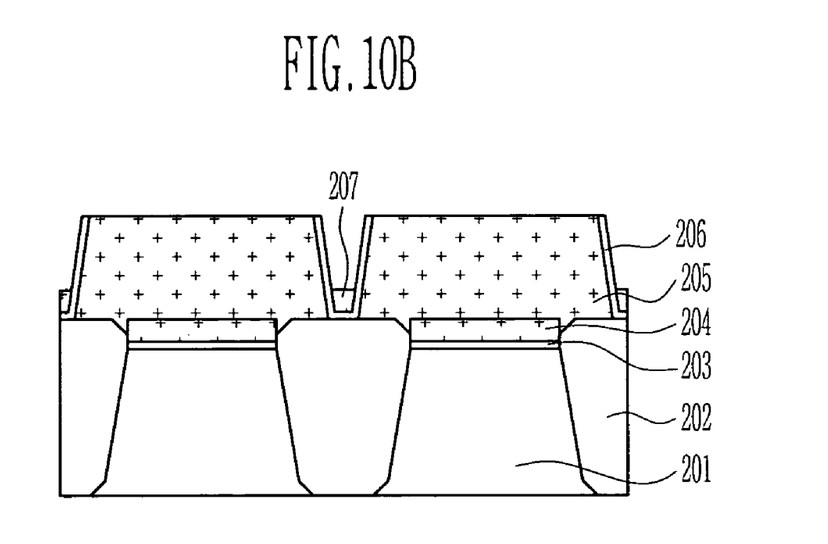

Referring to FIG. 10A and FIG. 10B, the dielectric layer 206 is etched under a condition that the etch rate selective ratio of an oxide layer and a polysilicon layer is 1:1 to 1.5:1. In this case, the etch process is performed by introducing $CF_4$ of about 50-150 sccm at a pressure of 3-6 mT and applying the bias power of 50-150 W and the source power of 300-400 W. Thus, a part of the second conductive layer 205 is etched as the dielectric layer 206 is stripped on lines A-A' as shown in FIG. 10A. Portions of the third conductive layer 207 and second conductive layer 205 are etched as some of the exposed dielectric layer 206 are etched on lines B-B' as shown in FIG. 10B. In other words, after the dielectric layer 206 remaining on the second conductive layer 205 is stripped, the etch process is performed on lines B-B' so that the third conductive layer 207 and the second conductive layer 205 remain in thickness of about 500-1200 Å. In the prior art, the dielectric layer existing on the sidewall of the floating gate is stripped by securing isotropic etch properties. In this case, two problems occur. Firstly, if the etch target is increased so as to strip the dielectric layer existing as many as the thickness of the second conductive layer, the hard mask layer is lost. It is thus necessary to increase the thickness of the hard mask layer as many as the thickness lost. This results in a problem that the photoresist layer margin is reduced when the hard mask layer is patterned. Further, there is another problem that the tunnel oxide layer is damaged because damage of the field oxide layer becomes severe. In the present invention, however, as the condition that the etch selective ratio of the oxide layer and the polysilicon layer is 1:1 to 1.5:1 when the dielectric layer is etched is used, the third conductive layer existing between the dielectric layer, the floating gate pattern and the floating gate pattern can be easily stripped. Damage of the hard mask layer and damage of the field oxide layer depending on an increase of the etch target can be thus minimized.

Figure 11A:
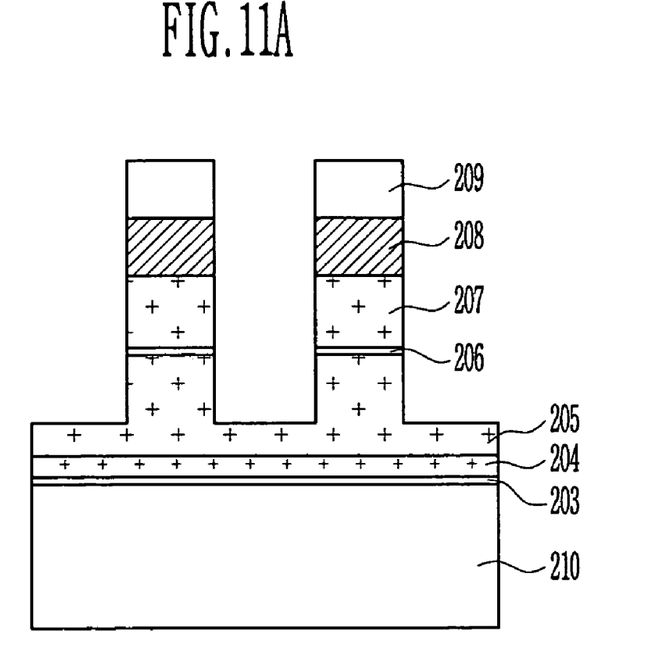
Figure 11B:
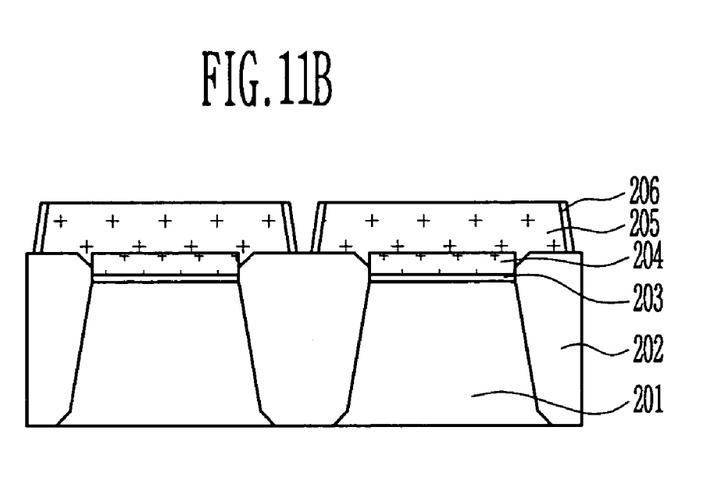

By reference to FIG. 11A and FIG. 11B, the remaining third conductive layer 207 is stripped by performing an etch process under the condition that the oxide layer selective ratio is over 100:1, so that damage of the hard mask layer 209 and the isolation layer 202 is minimized. In this case, the etch process includes introducing HBr of 100-200 sccm, $O_2$ of 1-5 sccm and He of 50-100 sccm so that $HBr/O_2/He$ are mixed in the ratio of 70:1:30 to 80:1:40 at a pressure of 20-50 mT, and applying the bias power of 100-200 W. Thereby, as shown in FIG. 11B, while the third conductive layer 207 is completely stripped on lines B-B', potions of the dielectric layer 206 and the second conductive layer 205 are etched and a portion of the isolation layer 202 is recessed. As shown in FIG. 11A, a portion of the second conductive layer 205 is etched on lines A-A'.

Figure 12A:
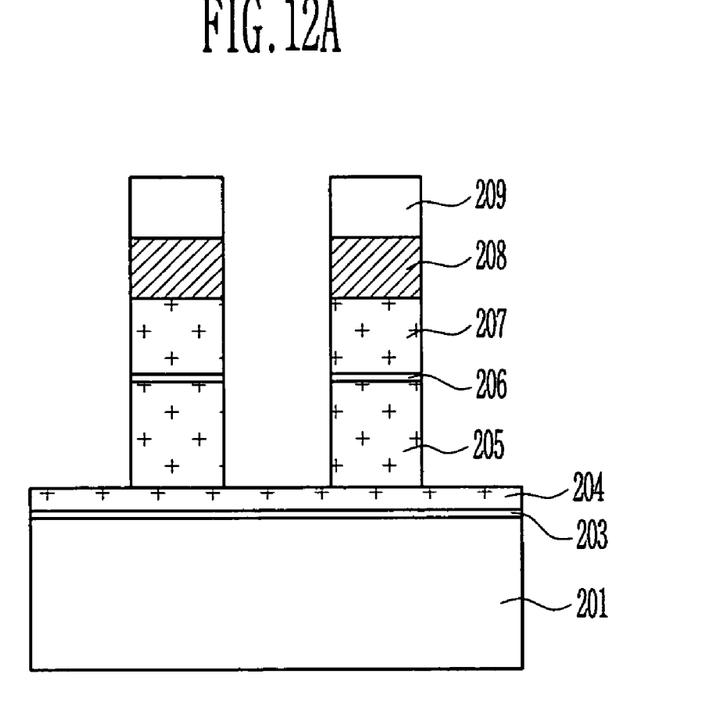
Figure 12B:
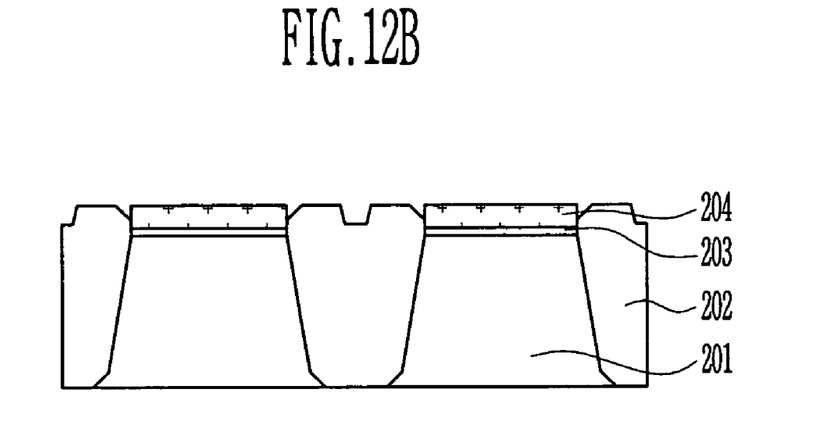

Referring to FIG. 12A and FIG. 12B, the second conductive layer 205 and the dielectric layer 206 are stripped under the condition that the etch rate selective ratio of the oxide layer and the polysilicon layer is 1:1 to 1.5:1. At this time, a thickness of the second conductive layer 205 remains about 100-300 Å. The reason is for preventing etch damage of the semiconductor substrate 201 due to a low etch selective ratio of the dielectric layer 206. In the case, the etch process includes introducing $CF_4$ of 10-200 sccm at a pressure of 4-10 mT and applying the bias power of 50-200 W and the source power of 300-700 W.

Meanwhile, a native oxide layer may exist between the first conductive layer 204 and the second conductive layer 205. If a process that the selective ratio of the oxide layer and the polysilicon layer is 1:1 to 1.5:1 is not used, etch is stopped at the interface between the second conductive layer 205 and the first conductive layer 204. Resultantly, there occurs a problem that the gate bottom profile has a tail. Accordingly, as shown in FIG. 12A, the second conductive layer 205 is completely stripped on lines A-A', so that the first conductive layer 204 is exposed. As shown in FIG. 12B, the dielectric layer 206 and the second conductive layer 205 are stripped on lines B-B', so that the underlying structure, i.e., the isolation layer 202 and the first conductive layer 204 are exposed.

Figure 13A:
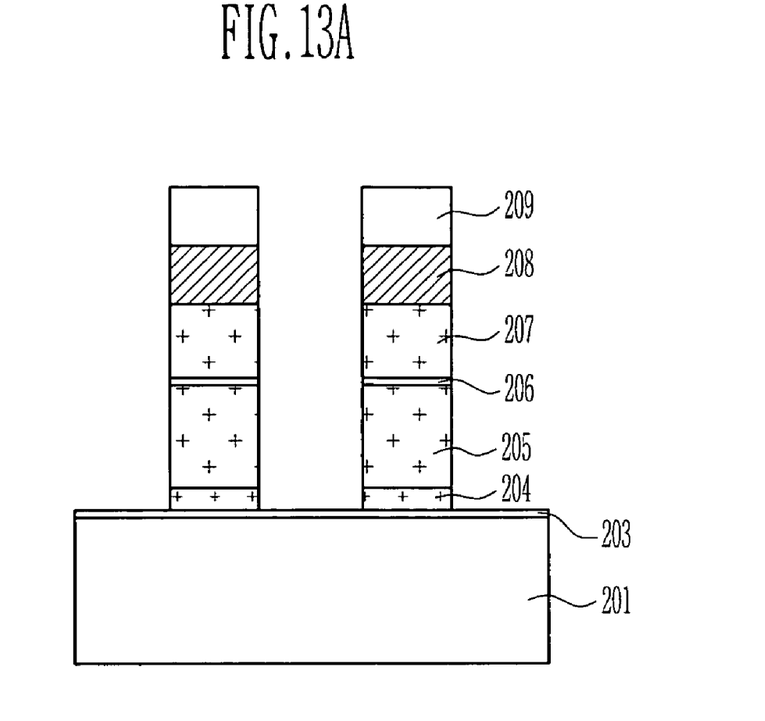
Figure 13B:
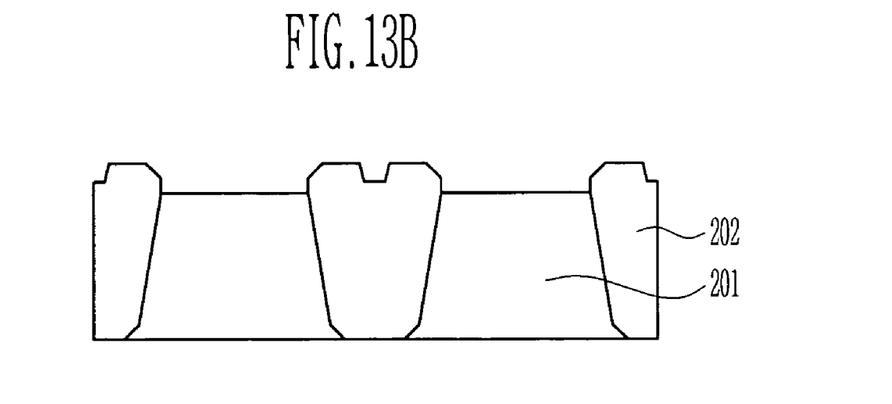

By reference to FIG. 13A and FIG. 13B, the remaining second conductive layer 205 and first conductive layer 204 are stripped. This process is implemented under the condition that the etch selective ratio of the conductive layer and the oxide layer is 10:1 to 20:1. This process includes introducing HBr of 150-200 sccm and He of 50-150 sccm and applying the bias power of 150-300 W and the source power of 300-600 W. At this time, it is preferred that the etch target is over-etched about 30-50% of the effective thickness of the isolation layer 202 considering the effective thickness of the semiconductor substrate 201 and the isolation layer 202. Furthermore, unlike a conventional etch condition, the selective ratio of the substrate tunnel oxide layer and the first conductive layer 204 and isolation layer 202 that are used in the isolation process is used so as to strip a conductive layer stringer due to the dielectric layer 205 fence depending on the step.

Meanwhile, in the respective processes described with reference to FIG. 7 to FIG. 13, the etch gas used in each process is exhausted from the etch apparatus before a next process is performed. After an etch gas for implementing a corresponding process is introduced, an etch process is implemented. A pressure or bias is also controlled as a condition used in a corresponding process.

According to the present invention described above, by forming a control gate and a floating gate at the same time by a single dry and etch process, a process time is reduced. As a post-cleaning process is not performed through a unitary etch process, the process can be thus significantly improved. Further, it is possible to further stably improve failure due to a gate bridge caused by etch chamber particles through process management by means of a single dry etch process. The cost price can be reduced through reduced process and stable properties can be secured in the yield of the device. In addition, problems due to damage of a hard mask and a dielectric layer and damage of a gate profile due to the post-cleaning process when the gate profile is formed through three-times dry etch can be fundamentally improved. It is thus possible to improve a gate etch process margin and to maximize dielectric interface gate CD efficiency. Accordingly, gate line sheet resistance is improved and a gate bridge is improved.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a flash memory device, comprising:
   forming a tunnel oxide layer and a first conductive layer on a semiconductor substrate and then performing a shallow trench isolation process to form an isolation structure that defines a first region and a second region;
   forming a second conductive layer on the entire structure and then patterning the second conductive layer and the first conductive layer to form a floating gate pattern;
   forming a dielectric layer, a third conductive layer, a fourth conductive layer and a hard mask layer on the entire structure and then patterning the hard mask layer; and
   forming a control gate and a floating gate by performing an etching process from the fourth conductive layer to the first conductive layer in a single etch apparatus using the hard mask layer as a mask;
   wherein the etching process comprises the steps of:
   (a) over-etching the fourth conductive layer;
   (b) etching the third conductive layer to expose the dielectric layer on the first region, and performing over-etch for a thickness of the third conductive layer to expose the dielectric layer on the second region;
   (c) etching the dielectric layer to expose a portion of the second conductive layer on the first region, and etching portions of the third conductive layer and the second conductive layer while stripping a portion of the dielectric layer on the second region;
   (d) stripping the third conductive layer remaining on the second region;
   (e) etching the second conductive layer on the first region and at the same time stripping the dielectric layer and the second conductive layer remaining on the second region; and
   (f) stripping the first conductive layer.

2. The method as claimed in claim 1, wherein the hard mask layer has a stack structure of an insulating layer and an anti-reflection layer.

3. The method as claimed in claim 2, wherein the hard mask layer has one of a stack structure of an anti-reflection layer, a PE-TEOS layer and an anti-reflection layer, a stack structure of an anti-reflection layer, a plasma enhanced nitride layer and an anti-reflection layer, a stack structure of a PE-TEOS layer and an anti-reflection layer, and a stack structure of a nitride layer and an anti-reflection layer.

4. The method as claimed in claim 1, wherein the hard mask layer is patterned by means of an etch process using a mixed gas of $CF_4/CHF_3/O_2$ or $CF_4/CHF_3$ at a pressure of 80 to 150 mT.

5. The method as claimed in claim 4, wherein in case of $CF_4$ and $CHF_3$, $CF_4$ of 60 to 90 sccm and $CHF_3$ of 20 to 50 sccm are introduced so that $CF_4$ and $CHF_3$ are mixed in the ratio of 1.5:1 to 3:1.

6. The method as claimed in claim 4, wherein in case of $CF_4$ and $CHF_3$, $CF_4$ of 20 to 50 sccm and $CHF_3$ of 60 to 90 sccm are introduced so that $CF_4$ and $CHF_3$ are mixed in the ratio of 1:1.5 to 1:3.

7. The method as claimed in claim 3, further comprising the step of performing an anneal process under nitrogen atmosphere after the anti-reflection layer is formed.

8. The method as claimed in claim 1, wherein step (a) is implemented using a mixed gas of $Cl_2/CF_4/N_2$ or $Cl_2/SF_6/N_2$ at a pressure of 4 to 10 mT.

9. The method as claimed in claim 8, wherein $Cl_2$ of 100 to 140 sccm and $CF_4$ of 10 to 20 sccm are introduced so that $Cl_2$ and $CF_4$ are mixed in the ratio of 6:1 to 8:1, and $N_2$ of 5 to 20 sccm is introduced.

10. The method as claimed in claim 8, wherein $Cl_2$ of 100 to 140 sccm and $SF_6$ of 5 to 10 sccm are introduced so that $Cl_2$ and $SF_4$ are mixed in the ratio of 14:1 to 16:1, and $N_2$ of 5 to 20 sccm is introduced.

11. The method as claimed in claim 1, wherein step (b) is implemented using a mixed gas of HBr and $O_2$ at a pressure of 30 to 70 mT.

12. The method as claimed in claim 11, wherein HBr of 100 to 200 sccm and $O_2$ of 1 to 5 sccm are introduced so that HBr and $O_2$ are mixed in the ratio of 35:1 to 40:1.

13. The method as claimed in claim 1, wherein step (c) is implemented by introducing $CF_4$ of 50 to 150 sccm at a pressure of 3 to 6 mT and applying the bias power of 50 to 150 W and the source power of 300 to 400 W.

14. The method as claimed in claim 1, wherein step (d) is implemented by using a mixed gas of $HBr/O_2/He$ at a pressure of 20 to 50 mT and applying the bias power of 100 to 200 W.

15. The method as claimed in claim 14, wherein HBr of 100 to 200 sccm, $O_2$ of 1 to 5 sccm and He of 50 to 100 sccm are introduced so that $HBr/O_2/He$ are mixed in the ratio of 70:1:30 to 80:1:40.

16. The method as claimed in claim 1, wherein step (e) is implemented by introducing $CF_4$ of 10 to 200 sccm at a pressure of 4 to 10 mT and applying the bias power of 50 to 200 W and the source power of 300 to 700 W.

17. The method as claimed in claim 1, wherein step (f) is implemented by introducing HBr of 150 to 200 sccm and He of 50 to 150 sccm and applying the bias power of 150 to 300 W and the source power of 300 to 600 W.

* * * * *